United States Patent
Shepherd et al.

(10) Patent No.: US 7,463,790 B2
(45) Date of Patent: Dec. 9, 2008

(54) CALCULATION MODULE

(75) Inventors: John Shepherd, Stafford (GB); Mark L. Whatley, Worcester (GB); Roger W. Brassington, Stoke on Trent (GB)

(73) Assignee: J.C. Bamford Excavators Limited, Uttoxeter (GB)

( * ) Notice: Subject to any disclaimer, the term of this patent is extended or adjusted under 35 U.S.C. 154(b) by 686 days.

(21) Appl. No.: 11/219,922

(22) Filed: Sep. 6, 2005

(65) Prior Publication Data

US 2006/0050989 A1  Mar. 9, 2006

(30) Foreign Application Priority Data

Sep. 8, 2004  (GB) ................. 0419882.6

(51) Int. Cl.
  *G06K 9/36* (2006.01)
(52) U.S. Cl. .............. 382/291; 382/286; 358/504
(58) Field of Classification Search ........... 382/282, 382/286, 287, 291; 358/504, 538
  See application file for complete search history.

(56) References Cited

U.S. PATENT DOCUMENTS

| | | | |
|---|---|---|---|
| 4,631,519 A | 12/1986 | Johnston | |
| 6,430,303 B1 * | 8/2002 | Naoi et al. | 382/104 |
| 6,799,130 B2 * | 9/2004 | Okabe et al. | 702/82 |
| 7,027,662 B2 * | 4/2006 | Baron | 382/275 |
| 7,054,489 B2 * | 5/2006 | Yamaoka et al. | 382/203 |
| 7,184,153 B2 * | 2/2007 | Leonhardt | 358/1.12 |
| 2002/0020070 A1 | 2/2002 | Takeuchi | |

FOREIGN PATENT DOCUMENTS

| | | |
|---|---|---|
| GB | 2 220 314 A | 1/1990 |
| GB | 2 335 980 A | 10/1999 |

OTHER PUBLICATIONS

United Kingdom Further Search Report under Section 17, dated Feb. 2, 2005.
United Kingdom Search Report under Section 17, dated Nov. 7, 2005.

* cited by examiner

*Primary Examiner*—Yosef Kassa
(74) *Attorney, Agent, or Firm*—Marshall, Gerstein & Borun LLP

(57) ABSTRACT

A calculation module for calculating the position of a mechanical element, the calculation module being operable to receive an input signal, detect a first plurality of corresponding features in the input signal, calculate the spacing between successive features of the first plurality of corresponding features, generate a first numerical sequence in accordance with the spacing between successive features of the first plurality of corresponding features, detect a second plurality of corresponding features in the input signal, calculate the spacing between successive features of the first plurality of corresponding features, and generate a second numerical sequence in accordance with the spacing between successive features of the first plurality of corresponding features.

50 Claims, 7 Drawing Sheets

CALCULATION MODULE

BACKGROUND TO THE INVENTION

This image relates to a calculation module for calculating the position of a moveable element, and an apparatus including a moveable mechanical element and a calculation module, particularly but not exclusively for a fluid operated ram where the mechanical element comprises a piston rod.

It is desirable for many applications, and particularly control applications, to know the position of a moveable part of an apparatus.

DESCRIPTION OF THE PRIOR ART

In the particular example of piston rods, it is known from our earlier patent no. GB 2335980 B to provide an optically readable marking on the rod which is detectable and can be used to determine the position of the rod. In the particular example, the optically readable marking comprises a pseudo-random binary sequence of order N, wherein each N-bit word of the sequence is unique and so can be used to deduce the rod's position. The marking is detected by illuminating the marking using a suitable source, detecting the reflected light with a detector array and determining the sequence of binary digits from the output signal of the detector array.

A difficulty with all such systems is that of reliably extracting the digits from the output signal, due to, for example, the optical marking becoming worn or obscured by dirt or grease This is particularly the case where the mechanical element is likely to be used in circumstances where wear or contamination is to be expected, such as when the mechanical element is a piston rod on a material handling vehicle.

An aim of the invention is to reduce or overcome one or more of the above problems.

SUMMARY OF THE INVENTION

According to a first aspect of the invention, we provide a calculation module for calculating the position of a moveable element, the calculation module being operable to receive an input signal, detect a first plurality of corresponding features in the input signal, calculate the spacing between successive features of the first plurality of corresponding features, generate a first numerical sequence in accordance with the spacing between successive features of the first plurality of corresponding features, detect a second plurality of corresponding features in the input signal, calculate the spacing between successive features of the second plurality of corresponding features and generate a second numerical sequence in accordance with the spacing between successive features of the second plurality of corresponding features.

The step of generating a numerical sequence may comprise generating a binary sequence in which a spacing between two successive features having a first value corresponds to a binary '1' digit and a spacing between two successive features having a second value corresponds to a binary '0' digit.

The calculation module may be operable to generate first verification information associated with the first numerical sequence and second verification information associated with the second numerical sequence to indicate possible errors in the respective numerical sequence.

According to a second aspect of the invention, we provide a calculation module for calculating the position of a mechanical element, the calculation module being operable to receive an input signal, detect a plurality of corresponding features in the input signal, calculate the spacing between successive corresponding features, general a numerical sequence in accordance with the spacing between successive corresponding features and general verification information associated with the numerical sequence to indicate possible errors in the numerical sequence.

In either aspect of the invention the calculation module may be operable to generate verification data such that, where the spacing does not have one of a first value or a second value, the verification data indicates a possible error in the numerical sequence.

The first value may comprise a first range of values and the second value may comprise a second range of values.

The calculation module may be operable, where the spacing does not have one of a first value or second value, to infer possible digits of the numerical sequence and indicate the inferred digits in the verification data.

The step of inferring possible digits may comprise one of:
when the spacing is less than the first value and second value, disregarding the spacing;
when the spacing is greater than the first value and second value, inferring a group of two digits in accordance with the spacing.

The calculation module may be operable to generate verification data indicating a possible error when the spacing is within the first range or second range but wherein the spacing is within a selected distance of the boundary of the range.

The calculation module may be operable to generate location information in accordance with the numerical sequence.

The numerical sequence may comprise a part of a pseudo-random binary sequence comprising a plurality of unique words, wherein each word corresponds to a position of the mechanical element.

The numerical sequence may be longer than a word of the pseudorandom binary sequence, such that the numerical sequence comprises a plurality of words, and wherein the position information comprises a plurality of positions calculated from each numerical sequence.

A word of the numerical sequence may be rejected if the verification data indicates a number of possible errors in that word greater than a maximum error value.

The calculation module may be operable, where the verification data indicates that one or more digits of a word have a plurality of possible values, to generate position information from each numerical sequence corresponding to the possible values of the one or more digits.

The calculation module may be operable to generate a confidence value corresponding to each position.

The calculation module may be operable, where a plurality of numerical sequences are generated, to calculate position information for each numerical sequence, compare the position information and generate an output position accordingly.

The calculation module may be operable to generate an output confidence value in accordance with the confidence value corresponding to each position.

The calculation module may be operable to store a plurality of output positions in a position history and generate a predicted position from the stored output positions and, when a further output position has a corresponding output confidence value lower than a confidence threshold, compare the further output position with the predicted position and, if the further output position is within an acceptance range of the predicted position, accept the further output position as a valid output position and store it in the position history Where the further output position is outside the acceptance range or below a rejection threshold, the predicted position may be used to generate the output position.

The calculation module may comprise a failure counter, wherein the failure counter is incremented when the predicted position is used to generate the output position and reset when an output position has a corresponding output confidence value higher than the confidence threshold or is accepted as a valid output position, and wherein a failure output is generated if the failure counter reaches a failure threshold.

The plurality of corresponding features of the input may signal comprise one of rising edges, falling edges, maxima or minima.

According to a third aspect of the invention, we provide an apparatus comprising a movable mechanical element, a marking, a calculation module according to the first or second aspect of the invention and a reader responsive to the marking to generate an input signal which is passed to the calculator module.

The marking may be optically readable.

The optically readable marking may comprise a surface having a first reflectivity and a plurality of areas having a second reflectivity, wherein said areas having a second reflectivity have a width which is generally constant in a direction parallel to the direction of movement of the mechanical element and each binary digit is indicated by the spacing between two of said areas having a second reflectivity.

The reader may comprise an illumination source and a detector comprising a detector array.

The marking may be provided on the mechanical element.

The mechanical element may comprise a piston rod of a fluid operated ram.

BRIEF DESCRIPTION OF THE DRAWINGS

The invention will now be described by way of example only with reference to the accompanying drawings wherein.

DESCRIPTION OF THE PREFERRED EMBODIMENTS

Figure 1:
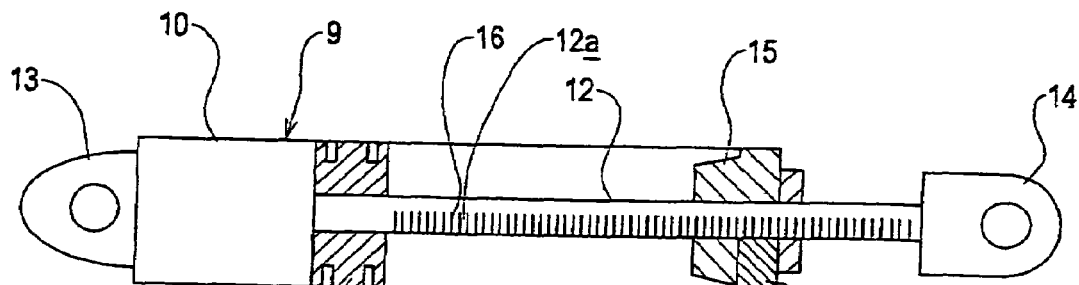
FIG. 1 is a schematic view of a fluid operable ram incorporating and embodiment of the invention.

Referring now to FIG. 1, a fluid operable ram is shown at 9 comprising a cylinder 10 having a piston 11 received in the cylinder 10 and attached to a piston rod 12. In the present example, the mechanical element comprises the piston rod 12, although it will be clear that the invention may be used with any suitable mechanical element. The cylinder 10 and piston rod 12 may be attached to other mechanical devices as desired by ears 13 and 14 respectively. One end of the cylinder 10 is sealed by a cylinder end cap 15. The piston rod 12 has a surface 12a marked with an optically readable marking 16 disposed on the surface 12a. A reader 17 is disposed within the cylinder end cap 15 and is connected to a processing unit indicated generally at 18 and having a calculation mode 18a.

The processing unit further comprises a data store 18c. The optically readable marking 16 comprises a series of code elements each encoding a numerical value based on the position of the code element along the length of the rod 12, in a fashion to be described hereinafter.

Figure 2:
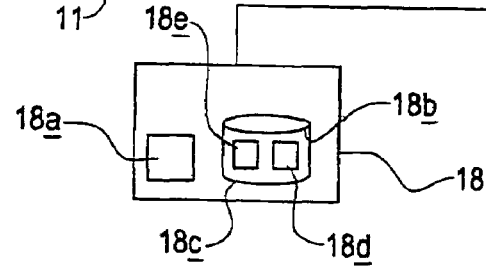
FIG. 2 is a cross section on line 2-2 of FIG. 1.
Figure 2:
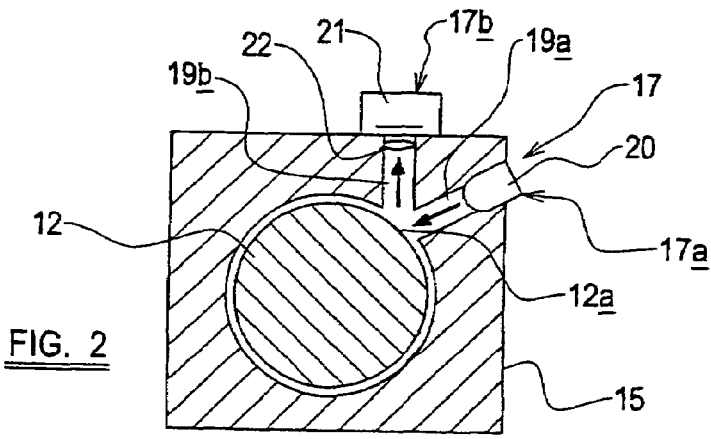

The reader 17 is shown in FIG. 2. Optical pathways 19a, 19b are provided in the end cap 15. An illumination source 17a comprising a number of light emitting diodes (LEDs) 20 transmits light down pathway 19a such that it falls upon a part of the optically readable marking 16 provided on the surface 12a of the piston rod 12. The optical pathway 19b is disposed such that light reflected from the surface 12a of the piston rod 12 travels along the pathway 19b and is focused onto the detector array 21 preferably by a lens 22. The LEDs 20 are disposed to provide even illumination of the part of the optically readable markings 16 viewed by the detector array 21 in order to simplify subsequent processing. The reader 17 is required to be compact to enable it to be mounted in or near the end cap 15 as shown.

Figure 3:
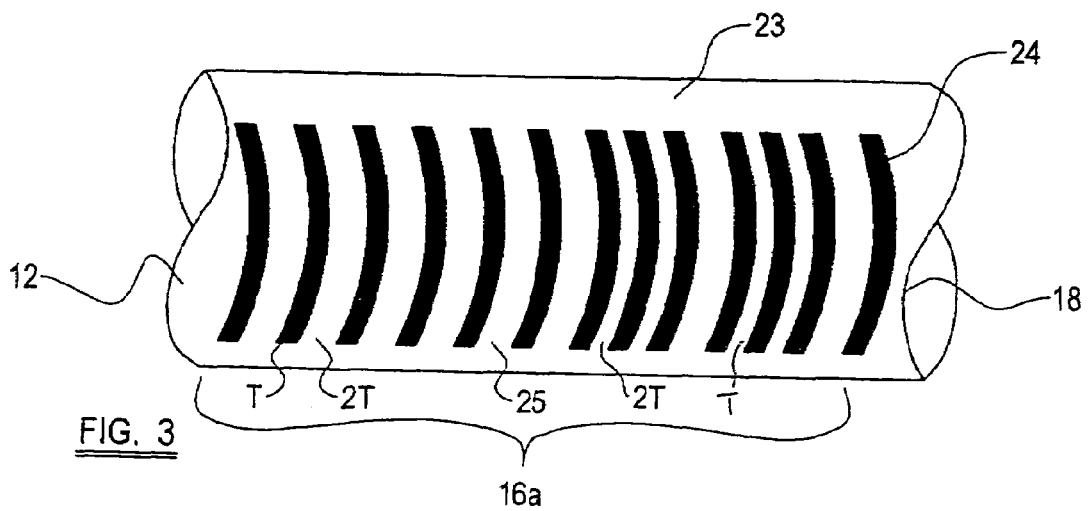
FIG. 3 is an enlarged view of a part of FIG. 1.

An example of the encoding scheme is shown in FIG. 3. This shows one code element 16a, that is, a distinguishable part of the optically readable marking 16 encoding one numerical value of binary digits (bits). The numerical value indicates the piston of the code element 16a on the rod 12. The code element 16a comprises a part 23 of the surface 12a of the piston rod 12 having a first reflectively upon which are marked areas 24 having a second, lower reflectively. The areas 24 have a fixed width T. Disposed between the areas 24 are spaces 25. The width of each space 25 encodes a bit; where the width of a space 25 is 2T, this indicates a bit having the value "1" and where a space 25 has a width of 1T, this indicates a bit having the value "0". The code element 16a shown in FIG. 3 thus encodes the binary sequence 111111001001.

The marking may comprise a series of successive, discrete, code elements, in which case end markers may be included, for example, a width of 4T between a pair of adjacent areas 24. In this case each successive code element 16a may encode value increasing with its position along the length of the rod. The size of the code element 16a dictates the resolution with which the rod position may be measured.

More preferably, the marking uses a pseudorandom binary sequence to encode the positional information. Pseudorandom sequences and methods of generating pseudorandom sequences are well known. The advantage is that for any pseudorandom sequence of order N, any N-bit segment of the sequence occurs only once, i.e. each N-bit segment is unique. The marking hence comprises a series of unique, overlapping words of length N bits.

Each word corresponds to a position of the rod 12 and the pairs of words and positions are stored in a look-up table 18d in the data store 18c. Where a sequence of order N is used as the pseudorandom sequence, the length in bits of the sequence is given by $2^{N-1}-1$ and the sequence produced will contain $2^{N-1}$ bits having the value "1" and $2^{N-1}-1$ bits having the value "0". The total length of the marking 16 for such a sequence where '1' bits have a width of 2T, '0' bits have a width of T and the digits are separated by marks of width T will be $(2^{N+1}+2^{N-1}+1)T$. The use of a pseudorandom sequence has the advantage that a single track of markings can be used to provide absolute position sensing with a resolution of the width of one binary digit. The resolution of the system can be selected by varying the length T and the order of the pseudorandom binary sequence, and the marking is scaleable for different lengths of mechanical elements by altering the order of the pseudorandom binary sequence.

The resolution of the position information can be further increased to the width of one detector of the detector array by calculating fine position as discussed below.

The linear detector array 21 comprises a semi-conductor device comprising an array of discrete photo-detectors or pixels arranged in a line disposed parallel to the longitudinal axis of the rod 12. Each photo-detector produces a signal whose voltage is proportional to the amount of light which falls upon the photo-detector. The intermediate signal from the detector array comprises a series of voltage values, each value corresponding to the signal of one of the photo-detectors. Each discrete value may be referred to by the position (hereinafter referred to as its 'detector number') of its producing detector n the array. The focusing means 22 and width T of the areas 24 is preferably selected such that the light from any given region of the surface 12a having a width T falls upon a plurality of photo-detectors.

The output of the detector array 21 provides an input signal which is passed to the processing units to amend to the calculation module 18a. The input signal will be a series of values, each value corresponding to one pixel of the detector array 21.

Figure 4:
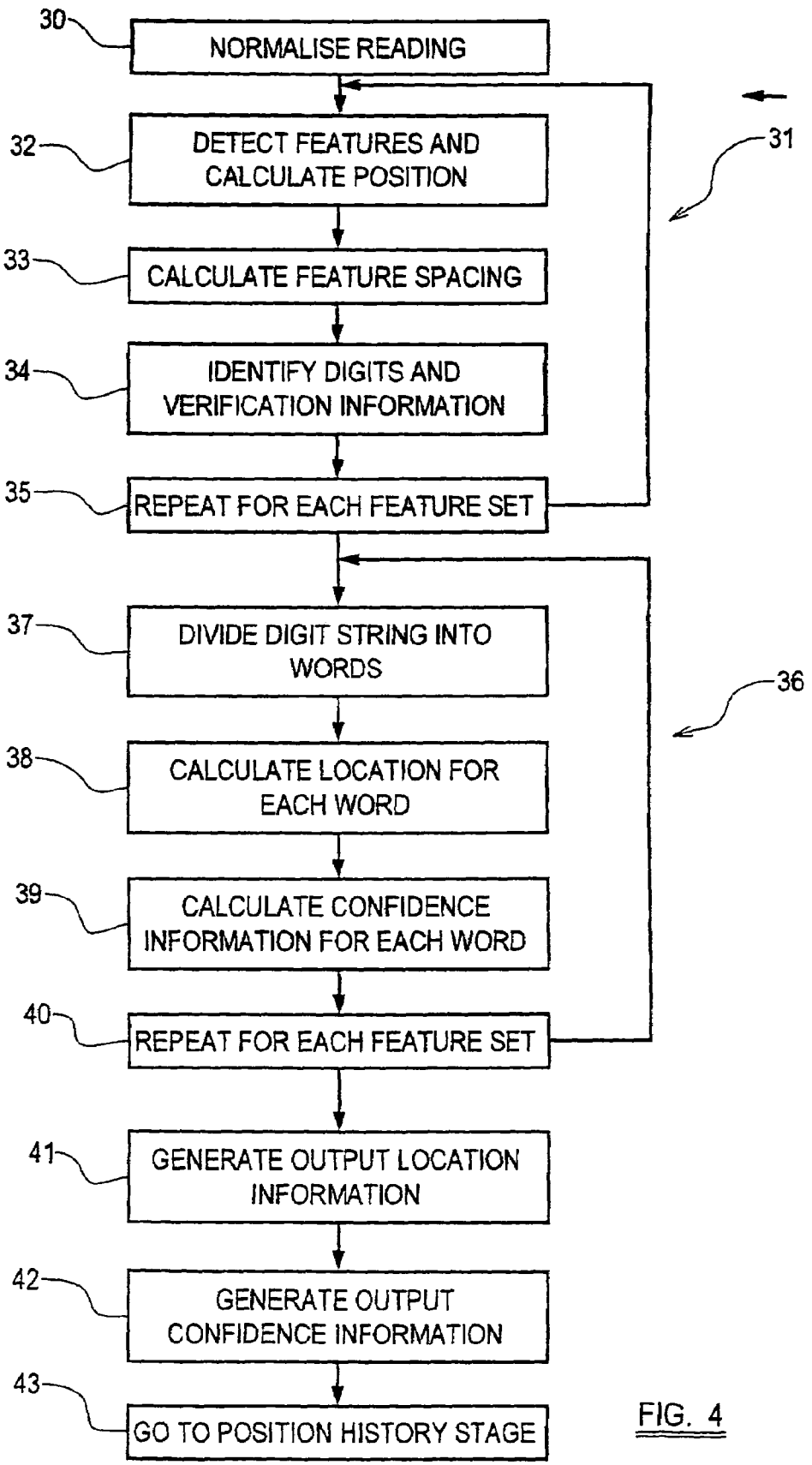
FIG. 4 is a flow diagram of a method according to the present invention.

The operation of the calculation module 18a is shown in FIG. 4.

At step 30, the input signal is normalised, for example to remove possible inconsistencies or errors in the signal resulting from different responses in the detector array 21 or an inconsistent intensity of lighting across the viewed area of the mechanical element from the illumination source. For example, a normalising signal from the detector array 21 may be recorded when the reader is viewing an un-marked surface. The normalising signal can then be subtracted from the input signal, thus removing the introduced errors.

Alternatively, a normalising signal can be generated dynamically for each reading. This is done by identifying areas of minimum values which equate to areas of marked surface. The values at the marked surface are then interpolated to provide baseline values for the intervening pixels. These values are then used to normalise the signal and remove any discrepancies. This procedure can equally be applied using areas of maximum value which equate to areas of unmarked code.

The calculation module is operable to perform a first loop as shown at 31. The calculation module detects the positions of a set of corresponding features as shown at step 32, and then at step 33 works out the spacing between the features. A feature is intended to refer to a part of the signal corresponding to a particular part of an area 24, for example a falling edge in the input signal corresponds to a leading or left-hand edge of an area 24, a minimum in the input signal corresponding to the centre point of each marking, or a rising edge in the input signal corresponding to the right-hand edge of an area 24 as shown. From the spacing between features, the digits of the numerical sequence can be derived. The calculation module 18a also generates verification data to indicate digit values that represent potential errors. As shown in step 35, the loop 31 is repeated for each plurality of corresponding features used in the calculation process. Each of these steps will be discussed in more detail below.

The calculation module then performs a second loop 36 in which the position information for the mechanical element is calculated. In the preferred example, the numerical sequence has more bits than the minimum number N required to obtain one code element of the pseudorandom binary sequence, and so a plurality of code elements company N bit words can be derived from the numerical sequence. For each N-bit word, at step 38 corresponding position information can be calculated and at step 39 a confidence level calculated for the position information based on the associated verification information. As shown at step 40, this process is performed for each feature.

The calculation module 18a then goes on to compare the position information calculated for each feature at 41, compare the results and generates a result comprising output position information. At step 42, the confidence levels associated with the position information are combined, and at step 43 the calculation module 18a generates an output comprising output confidence information accordingly.

The process as described is particularly advantageous in that, by using different features of the signal corresponding different parts of the optical marking, position information can be derived even when the optically readable marking 16 is, damaged, obscured or otherwise degraded. For example, it might be envisaged that although a number of right hand edges of the areas 24 may be damaged or obscured making the corresponding features in the input signal difficult to detect or 'noisy' and so producing errors in the feature spacing, reliable feature spacing information might still available from the minima-to-minima and rising-edge to rising-edge feature spacing. The method is advantageously used in the present invention where binary digits are encoded by spacing between areas of the marking, but it will be apparent that the technique of detecting different features might be applied to other situations or marking schemes, for example where digits are encoded by the width of areas whether or not the markings are regularly spaced, or where the numeral sequence is encoded in a base other than binary.

The different steps of the method of FIG. 4 will now be discussed in more detail;

Detection of Features

Figure 5A:
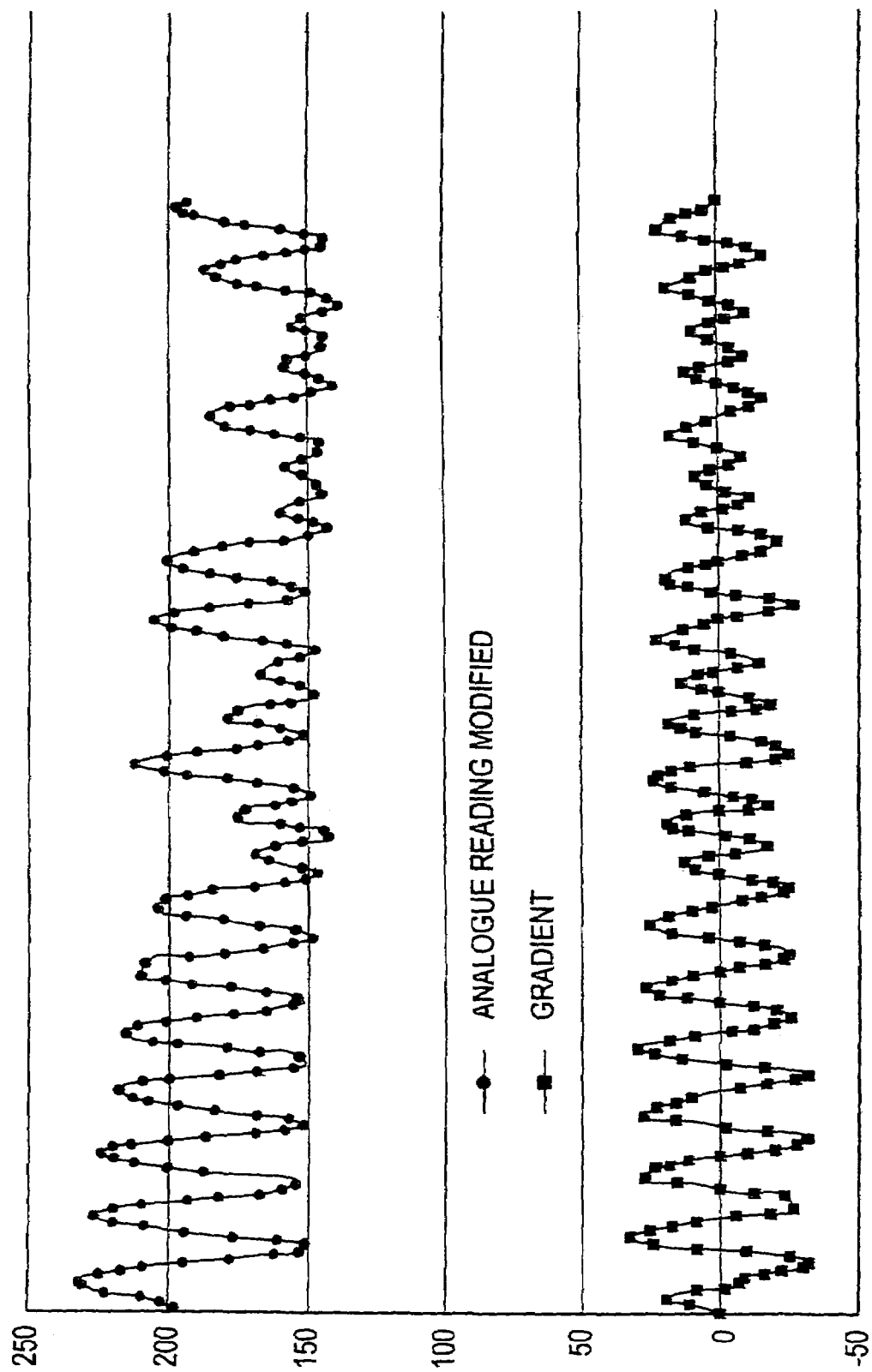
FIG. 5a is a graph of a signal and a calculated gradient of the signal.
Figure 5B:
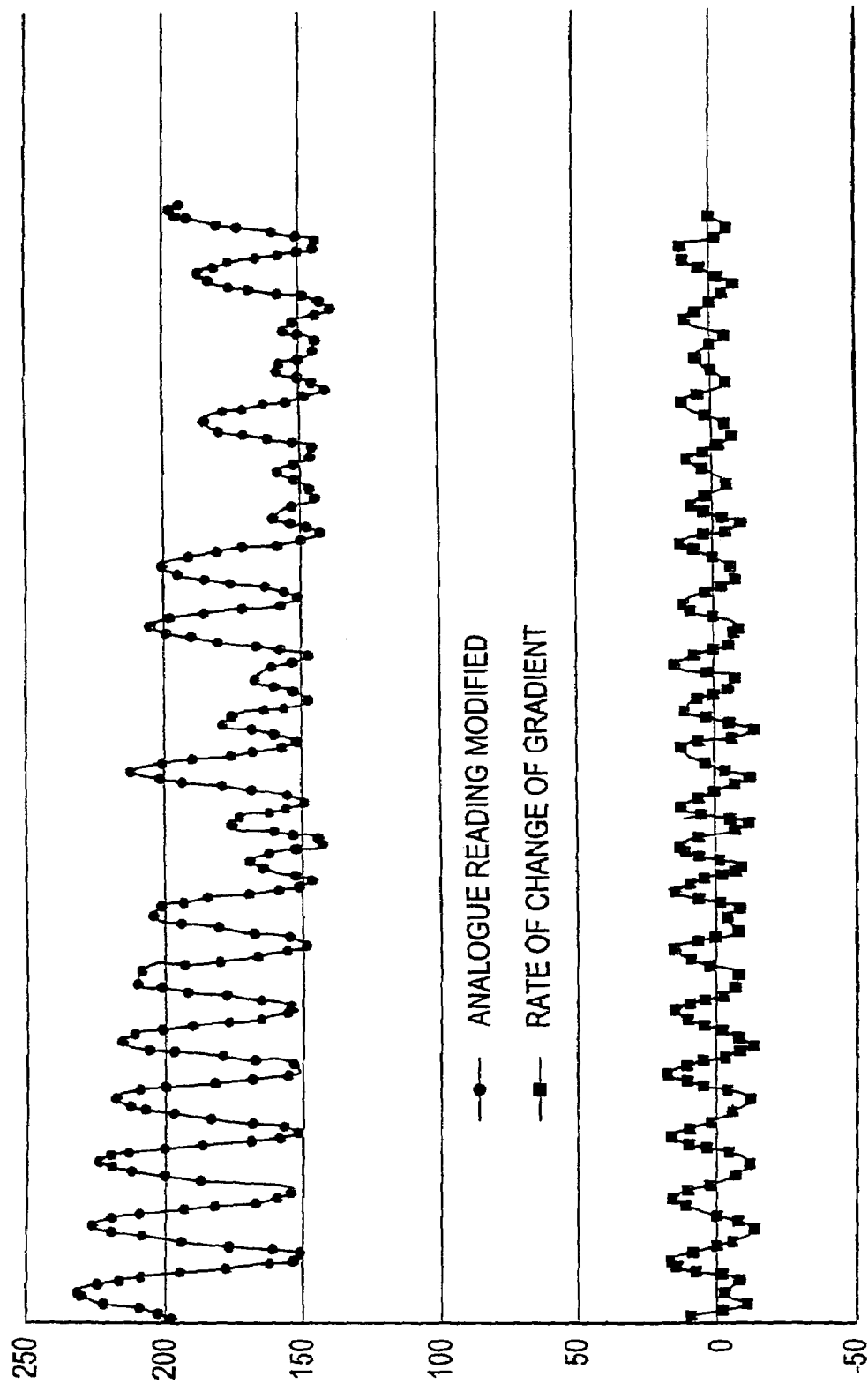
FIG. 5b is a graph showing a signal and a calculated rate of change of gradient of the signal.

With reference to FIGS. 5a and 5b, an example of a signal from the detector array 21 is shown as the upper trace in each graph. It will be apparent from the data that comparing the input signal to a threshold to identify digits will be inappropriate, and so features are detected according to the following rules;

1. Minimum to Minima (Corresponding to Centre Points of Markings)

The position of the pixels corresponding to each minimum is detected by locating the pixel point of the input signal at which the gradient of the signal passes through zero. A pixel is determined to be at a minimum if:

1. The gradient of the two pixels before the current pixel are negative, and

2. The gradient of the two pixels after the current pixel are positive and,

3. The value of the pixel under consideration is in the lower half of the numerical range of the input signal.

Advantageously, the gradient corresponding to each pixel can be simply calculated by subtracting the value of the preceding pixel from the value of the succeeding pixel, and the calculated gradient is shown in the lower graph of FIG. 5a.

To provide a more accurate position for the minimum, a simple linear interpolation step can be performed to estimate a location for the zero-crossing location of the gradient.

Where the detector array 21 has pixel spacing p, then the location $x_n$ of pixel n=np, and the offset d can be calculated from a simple interpolation formula:

$$d = \left(\frac{x_n}{x_n - x_{n+1}}\right)p$$

2. Falling-edge to Falling-edge (Left Hand Edge of Markings)

The first feature is the left hand edge of the markings as seen in FIG. 3, which can be detected by detecting the falling edges of the input signal. The falling edges are located by detecting points of minimum rate of change of gradient, which correspond to points of inflection in the input signal. The current pixel under consideration is considered to be at the point of minimum rate of change of gradient if:

1. the rate of change of gradient of the current pixel is negative, and
2. the rate of change of gradient of the pixel 3 before the current pixel is negative, and
3. the rate of change of the next pixel is positive, and
4. the rate of change of gradient of the pixel 3 after the current pixel is positive.

The rate of change of gradient can be simply calculated by subtracting the gradient of the preceding pixel from the gradient of the succeeding pixel. Once again an interpolation step can be performed to identify the zero crossing point of the rate of change of gradient graph as shown in the bottom graph of FIG. 5b.

3. Detection of Rising Edges (Right Hand Edge of Markings)

The third feature that may be used is the rising edges of the input signal, corresponding to the right hand edges of the optically readable marking 16, i.e. corresponding to a transition from low reflectivity to high reflectivity of the marking 16. The rising edges are located by detecting points of maximum rate of change of gradient. The position of a pixel of maximum rate of change of gradient change is determined if for example if;

1. the rate of change of the current gradient pixel is positive, and
2. the rate of change of the gradient of the pixel 3 before the current pixel is positive, and the rate of change of the next pixel is negative, and
3. the rate of change of gradient of the pixel 3 after the current pixel is negative.

Thus, this step can be performed using the rate of change of gradient calculated for the falling edge feature 2 above using the values shown in FIG. 5b. Once again, an interpolation step can be performed to find the position of the zero crossing more accurately.

From the calculated differences between features, the value of the corresponding binary digits can be calculated. In the present example, the nominal distance for a binary "1" is about 900 μm and the nominal distance for a binary "0" is 600 μm. In practice, a desirable range is allowed for each of these digits and these are set out in table 1. It will be apparent from the table that it is possible to infer the digits are missing or otherwise undetected and insert the appropriate digits into the sequence.

TABLE 1 feature spacing and corresponding binary digits.

| Digit | Nominal Value | Minimum Value | Maximum Value |
|---|---|---|---|
| 0 | 600 μm | 450 μm | 750 μm |
| 1 | 900 μm | 751 μm | 1050 μm |
| 00 | 1200 μm | 1050 μm | 1351 μm |
| 01 | 1500 μm | 1351 μm | 1650 μm |
| 10 | 1500 μm | 1351 μm | 1650 μm |
| 11 | 1800 μm | 1651 μm | 1950 μm |

As well as the binary numerical sequence digits from the spacing of the features, the calculation module 18a generates verification information associated with the numerical sequence, which in the present example consists of a string of digits each corresponding to an associated binary digit of the numerical sequence. In the verification information '0' indicates that the corresponding digit of the numerical sequence is accepted as a valid digit, and '1' indicates that the digit represents a possible error. In the present example, the verification information is generated as follows:

1. if the feature spacing is below 450 μm it will be assumed to be an error and will be disregarded. The verification information will have the bits corresponding the reading before and after the disregarded reading set to 1.
2. If the value of the calculated space is greater than of 1050 μm and less then 1950 μm, the correct digits of the numerical value of the digits will be '00', '10', or '11' in accordance with table 1, and the verification information corresponding to each of the digits will be set to one.
3. If any value is within 25 μm of its maximum or minimum value the corresponding bit of the verification information will be set to one to indicate that the calculated value border line.

TABLE 2 position information and bit values for minima.

| Position (Microns) | Distance between Each Turning Point | Bit Value | Verification Code |
|---|---|---|---|
| 924 | 0 | | |
| 1,837 | 912 | 1 | 0 |
| 2,738 | 901 | 1 | 0 |
| 3,627 | 889 | 1 | 0 |
| 4,513 | 886 | 1 | 0 |
| 5,440 | 926 | 1 | 0 |
| 6,345 | 905 | 1 | 0 |
| 6,931 | 585 | 0 | 0 |
| 7,525 | 594 | 0 | 0 |
| | | 0 | 1 |
| 9,017 | 1492 | 1 | 1 |
| 9,608 | 591 | 0 | 0 |
| 10,522 | 914 | 1 | 0 |
| 11,470 | 948 | 1 | 0 |
| 12,017 | 547 | 0 | 0 |
| 12,637 | 619 | 0 | 0 |
| 13,570 | 933 | 1 | 0 |
| 14,199 | 629 | 0 | 0 |
| 14,721 | 523 | 0 | 0 |
| 15,649 | 928 | 1 | 0 |

TABLE 3 position information and bit values for falling edges.

| Position (Microns) | Distance between Each Minimum Gradient | Bit Value | Verification Code |
|---|---|---|---|
| 713 | 0 | | |
| 1,556 | 843 | 1 | 0 |
| 2,513 | 957 | 1 | 0 |
| 3,394 | 881 | 1 | 0 |
| 4,267 | 873 | 1 | 0 |
| 5,175 | 908 | 1 | 0 |
| 6,105 | 930 | 1 | 0 |
| 6,740 | 635 | 0 | 0 |
| 7,337 | 597 | 0 | 0 |
| 8,092 | 755 | 1 | 0 |
| 8,799 | 707 | 0 | 0 |
| 9,447 | 648 | 0 | 0 |
| 10,287 | 840 | 1 | 0 |
| 11,240 | 953 | 1 | 0 |
| 11,847 | 608 | 0 | 0 |
| 12,467 | 620 | 0 | 0 |
| 13,272 | 805 | 1 | 0 |
| 13,930 | 658 | 0 | 1 |
| 14,055 | 125 | disregard | disregard |
| 14,557 | 627 | 0 | 1 |
| 15,403 | 846 | 1 | 0 |

TABLE 4 position information and bit values for rising edges.

| Position (Microns) | Distance between Each Maximum Gradient | Bit Value | Verification Code |
|---|---|---|---|
| 1,080 | 0 | | |
| 1,981 | 901 | 1 | 0 |
| 2,868 | 887 | 1 | 0 |
| 3,783 | 915 | 1 | 0 |
| 4,678 | 895 | 1 | 0 |
| 5,596 | 918 | 1 | 0 |
| 6,456 | 860 | 1 | 0 |
| 7,064 | 608 | 0 | 0 |
| 7,709 | 645 | 0 | 0 |
| 8,530 | 821 | 1 | 0 |
| 9,144 | 614 | 0 | 0 |
| 9,779 | 635 | 0 | 0 |
| 10,700 | 921 | 1 | 0 |
| 11,568 | 868 | 1 | 0 |
| 12,113 | 545 | 0 | 1 |
| 12210 | 97 | Disregard | Disregard |
| 12811 | 698 | 0 | 1 |
| 13,681 | 870 | 1 | 0 |
| 14305 | 624 | 0 | 0 |
| 14,895 | 590 | 0 | 0 |
| 15,796 | 901 | 1 | 0 |

To illustrate these steps, the position information, bit values (i.e. derived numerical sequence) and verification information for each feature is shown in tables 2 to 4. Table 2 shows the positions of the detected minima, table 3 shows the positions of the falling edges and table 4 the positions of rising edges in the input signal, and for illustrative purposes in each table an error has been introduced. In table 2, for example, the difference between the $10^{th}$ and $11^{th}$ detector positions is 1492 μm. Referring to table 1, this distance shows that the digits can be inferred to be 01 or 10. 01 is selected as a default as shown in bold in the column headed "bit value" and the corresponding bits of the verification information are set to 1 as shown in the column headed "verification code".

In table 3, the $19^{th}$ feature spacing value is less then 450 μm, so it is disregarded and the bits in the verification information corresponding to the preceding and succeeding values are set to 1. Similarly, the $15^{th}$ position in table 4 is less then 450 μm from the preceding position so it is disregarded and bits of the verification information corresponding to the preceding and succeeding position value set to "1".

It will thus be seen that the same or substantially the same numerical value, that is the same string of binary digits, is generated from the spacing information calculated using each of the three features. Where there is some disparity between these tables, in particular the $8^{th}$ and $9^{th}$ bit values as shown in table 2, these are indicated in the verification information as potential sources of error.

In the example where a position is at less than 450 μm from the previous position and is thus doubtful, a further step may be carried out to identify which of the doubtful position and the immediately preceding position is more accurate. This can be done by, for example, calculation of the distance between the position two places before the doubtful position and the position immediately after the doubtful position, and then calculating where the expected positions of intervening features should be. For example, from table 4, the $16^{th}$ position is questionable. Taking distance between the $14^{th}$ and $17^{th}$ positions which are believed to be good positions, the distance is 1243 μm. This suggests that the intervening binary digits should be 00 and so would suggest that the features should be approximately 600 μm from each of the $14^{th}$ and $17^{th}$ positions. It suggests that the feature location should be somewhere around 11568+600=12168 μm and 12811−600=12211 μm. By taking the total distance between points 15 and 16 and each of the expected targets, it can be seen that the total error for point 16 is 41 μm and that point 15 has an error of 153 μm, thus implying that point 16 is correct and point 15 should be disregarded.

Calculating Position Information

Figure 6:
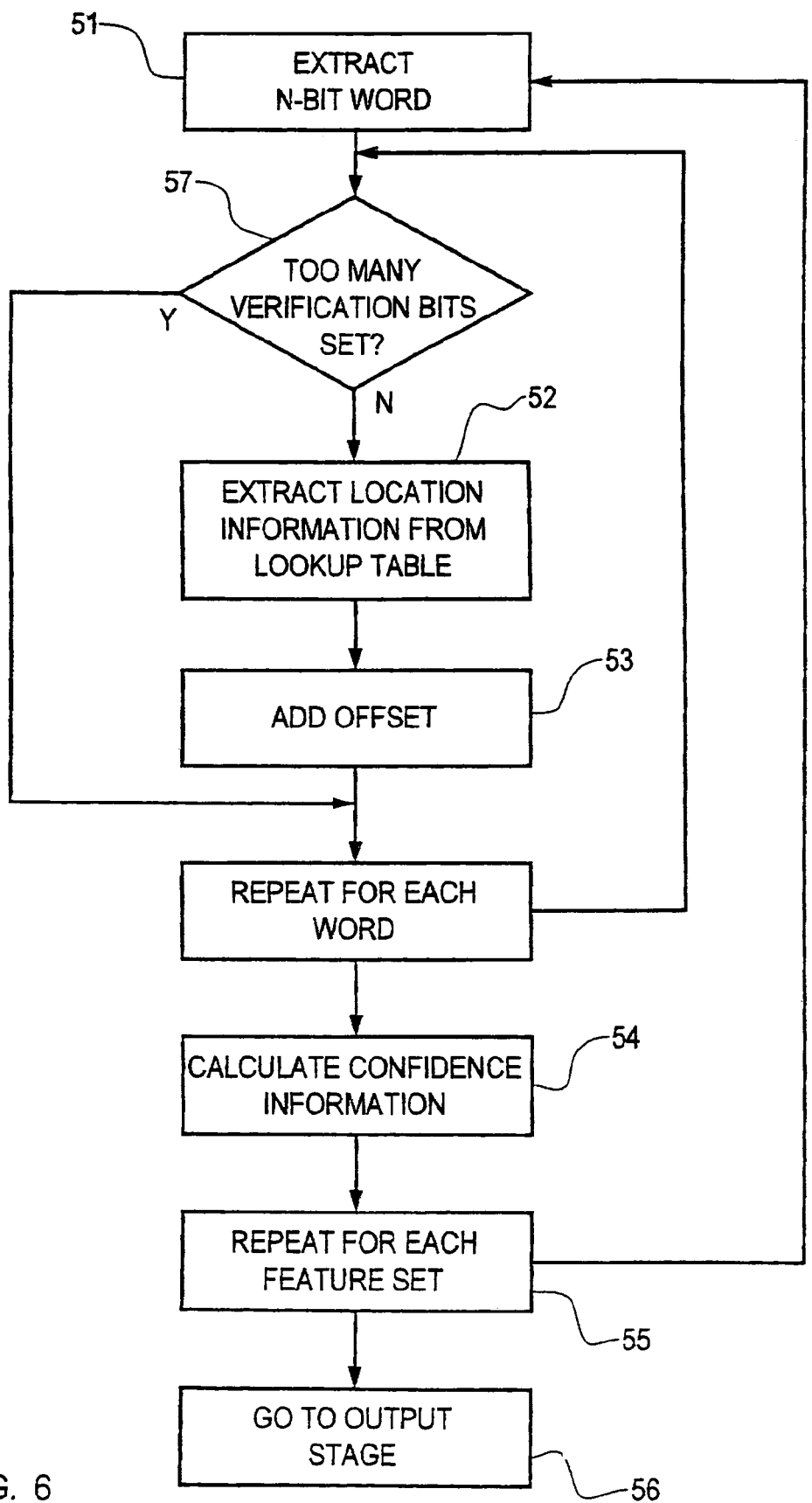
FIG. 6 is a flow diagram of part of the method of FIG. 4 in more detail.

The method for calculating position information from the numerical values of tables 2 to 4 is shown in more detail in FIG. 6. At step 50, all of the N-bit words are extracted from the numerical value. In the present example, the pseudorandom binary sequence is of order N=12 and the numerical value has 19 bits.

TABLE 5

12-bit words from Table 3.

| | | | | | | | | | | | | |
|---|---|---|---|---|---|---|---|---|---|---|---|---|
| Bit Data 1 | | | | | | | | | | | | |
| | 1 | 1 | 1 | 1 | 1 | 1 | 0 | 0 | 1 | 0 | 0 | 1 |
| Verif'n | 0 | 0 | 0 | 0 | 0 | 0 | 0 | 0 | 0 | 0 | 0 | 0 |
| Bit Data 2 | | | | | | | | | | | | |
| | 1 | 1 | 1 | 1 | 1 | 0 | 0 | 1 | 0 | 0 | 1 | 1 |
| Verif'n | 0 | 0 | 0 | 0 | 0 | 0 | 0 | 0 | 0 | 0 | 0 | 0 |
| Bit Data 3 | | | | | | | | | | | | |
| | 1 | 1 | 1 | 1 | 0 | 0 | 1 | 0 | 0 | 1 | 1 | 0 |
| Verif'n | 0 | 0 | 0 | 0 | 0 | 0 | 0 | 0 | 0 | 0 | 0 | 0 |
| Bit Data 4 | | | | | | | | | | | | |
| | 1 | 1 | 1 | 0 | 0 | 1 | 0 | 0 | 1 | 1 | 0 | 0 |
| Verif'n | 0 | 0 | 0 | 0 | 0 | 0 | 0 | 0 | 0 | 0 | 0 | 0 |

TABLE 5-continued 12-bit words from Table 3.

Bit Data 5

| | | | | | | | | | | | |
|---|---|---|---|---|---|---|---|---|---|---|---|
| | 1 | 1 | 0 | 0 | 1 | 0 | 0 | 1 | 1 | 0 | 0 | 1 |
| Verif'n | 0 | 0 | 0 | 0 | 0 | 0 | 0 | 0 | 0 | 0 | 0 | 0 |

Bit Data 6

| | | | | | | | | | | | | |
|---|---|---|---|---|---|---|---|---|---|---|---|---|
| | 1 | 0 | 0 | 1 | 0 | 0 | 1 | 1 | 0 | 0 | 1 | 0 |
| Verif'n | 0 | 0 | 0 | 0 | 0 | 0 | 0 | 0 | 0 | 0 | 0 | 1 |

Bit Data 7

| | | | | | | | | | | | | |
|---|---|---|---|---|---|---|---|---|---|---|---|---|
| | 0 | 0 | 1 | 0 | 0 | 1 | 1 | 0 | 0 | 1 | 0 | 0 |
| Verif'n | 0 | 0 | 0 | 0 | 0 | 0 | 0 | 0 | 0 | 0 | 1 | 1 |

Bit Data 8

| | | | | | | | | | | | | |
|---|---|---|---|---|---|---|---|---|---|---|---|---|
| | 0 | 1 | 0 | 0 | 1 | 1 | 0 | 0 | 1 | 0 | 0 | 1 |
| Verif'n | 0 | 0 | 0 | 0 | 0 | 0 | 0 | 0 | 0 | 1 | 1 | 0 |

Thus, the numerical value can be separated into 8 separate 12 bit words. For each word, the corresponding mechanical element position information is stored in a look-up table, and this position information is found at step 51. Where the verification information associated with the numerical value has a bit set against a bit of the N-bit word, then the look up table is accessed for each possible variant of the word, that is for each possible variant of each of the bits indicated as questionable by the verification information. In the example of Table 2, 2 bits are indicated as questionable, but from the spacings apparently the only possible values are 10 or 01. There are thus two possible variants for each 12-bit word in table 2. Additionally, where a bit is set indicating that a digit is within 25 μm of the boundary for that value, a variant will be tested for each value of that bit, and where two bits have associated bits set in the verification information, then there are four possible variants for that word.

At step 53, having obtained the coarse position from the look up table for each word and its variants, the offset of each word is added to provide a fine position. The offset is the position information of the first bit. In tables 2 to 4, the offset is thus the position given in the left hand column corresponding to the first bit of that word.

At step 54, a confidence level is generated by comparing all the possible positions which have been generated. The calculated positions are deemed to be the same if they match to within a given value, in the present example two within 0.5 mm. In the present example, the confidence level for each possible position is the proportion of the words (each word including its variants) that give a result corresponding to that position. As shown at step 55 this is repeated for each feature and at step 56, the positions and associated confidence information are passed to the output stage. At the step shown at 57, it is possible to reject a word if the verification information indicates a number of possible errors in that word which exceeds a maximum error value. In the present example, if the verification information contains four or more bits set to one, indicating four more possible errors in the word, then that word is rejected.

To take the numerical value from Table 3 as an example, the eight possible 12-bit words are shown in Table 5, along with the associated verification information. All of the words have fewer than 4 bits of the verification information set and so each word is accepted. For the words identified as bit data 6, bit data 7 and bit data 8, one or two verification information bits are set and so the position information is obtained from the look up table for each possible variant of the questionable bits.

TABLE 6 position information from look-up table corresponding to each word

| Bit Data 1 | Bit Data 2 | Bit Data 3 | Bit Data 4 | Bit Data 5 | Bit Data 6 | Bit Data 7 | Bit Data 8 |
|---|---|---|---|---|---|---|---|
| 634.2 | 633.3 | 632.4 | 631.5 | 630.6 | 629.7 | 629.1 | 628.5 |
| | | | | | 836.4 | 835.8 | 1892.7 |
| | | | | | | 1669.8 | 1669.2 |
| | | | | | | 2655.9 | 24.6 |

The positions obtained from the look up table for each set of bit data are shown in table 6. As discussed above, there are two possible values for bit data 6 and four possible values for data 7 and bit data 8 corresponding to the four possible values of the variants of the word.

TABLE 7 offset position for each word (μm).

| 1.556 | 2.513 | 3.394 | 4.267 | 5.175 | 6.105 | 6.740 | 7.337 |
|---|---|---|---|---|---|---|---|

Table 7 shows the offset position for each N-bit word, corresponding to the first column shown in table 3. This offset position is added to the coarse position information obtained from the look up table as shown in Table 6 to produce the fine position information as shown in table 8.

TABLE 8 fine position information

| Bit Data 1 | Bit Data 2 | Bit Data 3 | Bit Data 4 | Bit Data 5 | Bit Data 6 | Bit Data 7 | Bit Data 8 |
|---|---|---|---|---|---|---|---|
| 635.906 | 635.963 | 635.944 | 635.917 | 635.925 | 635.955 | 635.99 | 635.987 |
| | | | | | 842.655 | 842.69 | 1900.187 |
| | | | | | | 1676.69 | 1676.687 |
| | | | | | | 2662.79 | 32.087 |

Comparing the position information in table 8, and taking positions within 0.5 mm to match we then obtain the following possible correct readings and confidences.

| | |
|---|---|
| 8 at 635.9 mm | 100% |
| 2 at 842.6 mm | 25% |
| 2 at 1676.6 mm | 25% |
| 1 at 1900.2 mm | 12.5% |
| 1 at 2662.79 mm | 12.5% |
| 1 at 32.087 mm | 12.5% |

This process is performed for each numerical value for each feature, and the reading with the highest confidence value for each feature is then used to generate output position information and output confidence level.

Generating Output Position Information and Output Confidence Information

At step 42 of FIG. 4, the calculation module 18a compares the position reading generated from each feature and those position readings within a given tolerance range of each other in the present example 0.5 mm, are accepted as identifying the same position. Where more then one possible position is returned, the position selected most often is taken to be correct. The output position information is then calculated as the average of all such position readings. The confidence information associated with each position reading is used to calculate a composite output confidence value by calculating the average confidence value multiplied by the number of accepted position readings and divided by the total number of position readings. In the present example, the position readings generated are 636.0, 635.9 and 636.0, each with a confidence value of 100% and are within a tolerance band of 0.5 mm and so they are accepted. The average reading 629.95 mm is returned as the output position value together with a confidence reading of 100%.

It is of course possible that more than one position reading could be carried forward from a given set of feature information. To vary the above example, let us assume that the position readings and confidence values were 636.0 mm with a confidence value of 87.5%, 2839.2 mm with a confidence value of 87.5%, 635.9 mm with a confidence value of 100% and 636.0 mm with a confidence value of 100%.

The three values of 636.0 mm, 635.9 mm and 636.0 mm would be as accepted as showing the same position as they are within the tolerance range of 0.5 mm and thus the average of these three values provided as the output position information. The output confidence value would be the average confidence value x¾=70% and this would be the output confidence value.

Position History

Figure 7:
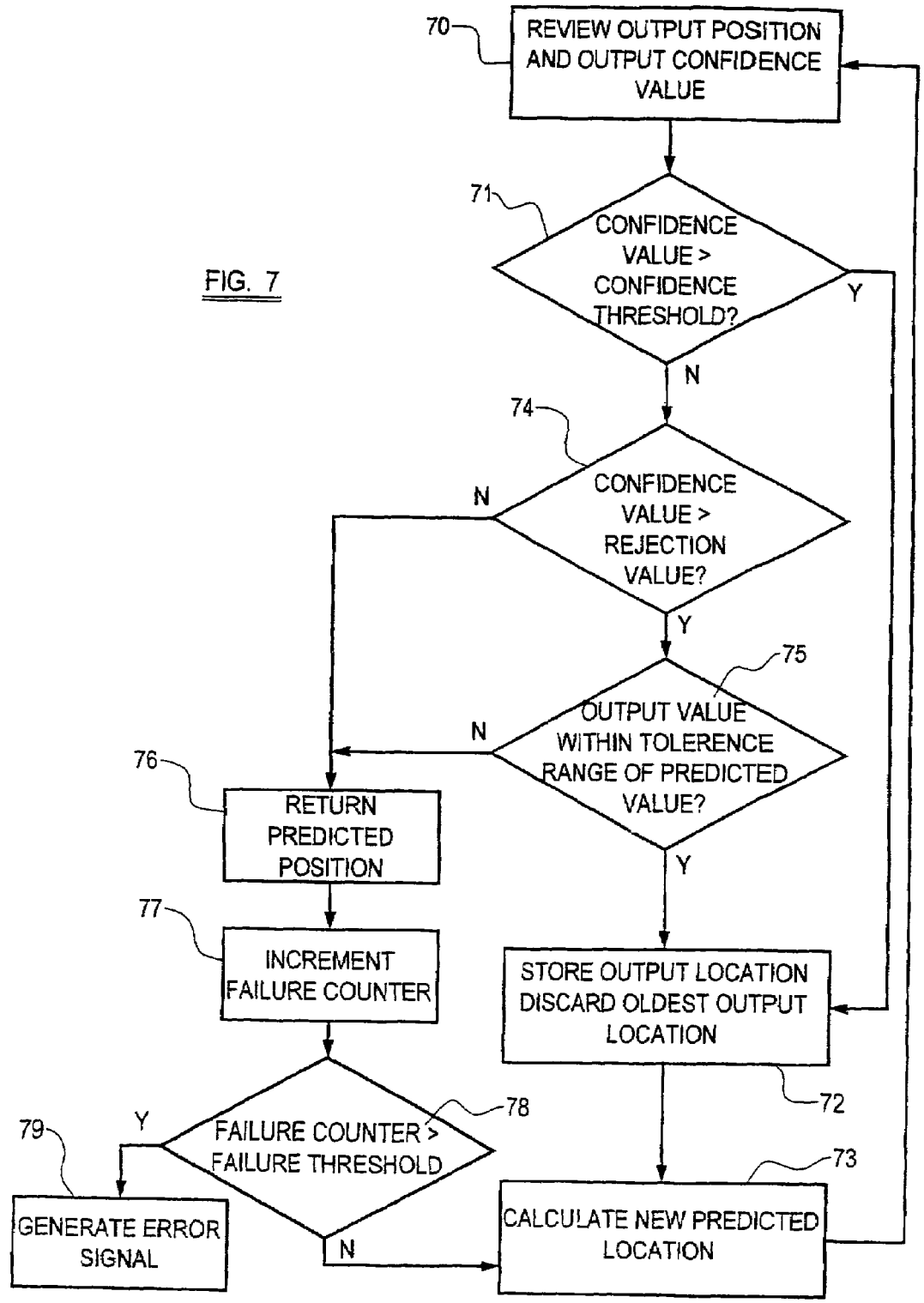
FIG. 7 is a flow diagram of a further part of the method of FIG. 4 in more detail.

To provide a further check on the output position, the calculation unit 18 stores a position history matrix, shown at 18e in the data store 19c and performs an output stage as illustrated in FIG. 7. The matrix stores the last two "good" output positions, a failure counter, a failure threshold and a predicted position. A "good" output position is one with an output confidence value greater than a confidence threshold, in the present example 75%.

At step 70, the output stage receives the output position information and confidence level, and at step 71 compares the confidence level with the confidence threshold. When an output position is generated which achieves a confidence value of over 75% than at step 72 the position history matrix is updated to store the output position as the last good position and discard the oldest stored output position. At step 73 the calculation module generates a predicted position from the stored output positions, for example by performing a linear extrapolation from the stored output positions.

When an output position is obtained which has a confidence value below the confidence value threshold, the confidence value is compared with a rejection threshold at step 74. If the confidence value is above the rejection threshold, then at step 75 the output position is compared with the predicted position and if it is within a tolerance band of the predicted position, for example, 5 mm, it is accepted as a good reading and the position history updated at step 72. If the output position is outside this range, than at step 76 the predicted position is used and at step 77 the failure counter is incremented. Similarly, if at step 74 the output position is below the rejection threshold, which may be for example, 50%, the predicted position is used at step 76 and the failure counter incremented at step 77. If at step 78 the failure counter reaches the value set by the failure threshold, then there is assumed to be a fault with the system and an error signal will be generated at step 79. The failure counter is reset wherever a reading is accepted as good.

If desired, it will be apparent that any number of past output positions may be stored and the predicted position calculated as desired, for example taking into account any change in speed apparent from a plurality of output positions.

Figure 8:
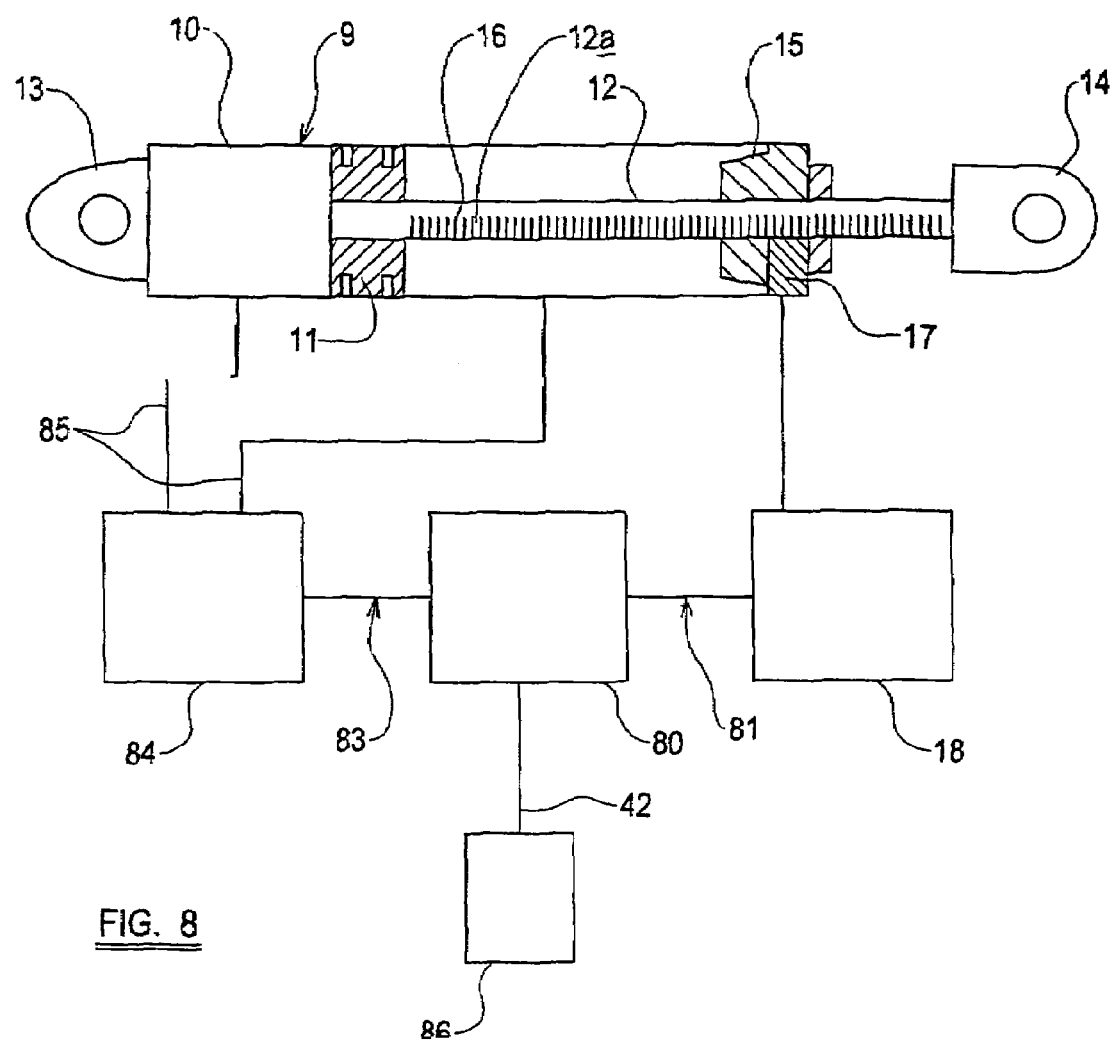
FIG. 8 is a schematic arrangement of an electronic feedback control system incorporating an embodiment of the invention.

Such an apparatus for determining the position of a mechanical element could be used in a servo system operable to control the mechanical element in response to the output signal of the apparatus. In the present example, suitable valve means may be provided whereby supply of fluid pressure to the cylinder is electronically controlled. A possible schematic arrangement is shown in FIG. 8. A fluid operable ram a like that shown in FIG. 1 comprises a reader 17 and processing unit 18 as hereinbefore described. The output position from the processing unit 18 is passed on line 81 to an electronic controller 80. Signals from other sensors or control means as desired may also be passed to the electronic controller 80 on line 82. The electronic controller 80 may then operate a fluid pressure control means 84 comprising, for example, a solenoid valve, by sending a signal on line 83 to control the supply of fluid on lines 85 to the ram 9 in response to the positional information from the processing unit 18 and sensor information on line 82. The rod 12 will move accordingly and its new position will be detected by the reader 17 and processing unit 18 and passed to the electronic controller 80. The electronic controller 80 may also generate an output, for example on a display 86.

The requirements of the optically readable marking 16 are that is should encode positional information such that the absolute displacement of the rod can be determined to a desired resolution, be tolerant of errors introduced by loss of areas 24 and minimise the number of areas 24 required on the rod surface. It is also desirable that the marking be durable and corrosion resistant, and as far as possible not impair the corrosion resistance of the rod itself.

While in the present example a suitable marking system is used such as that disclosed in our patent no. GB 2335980 B, it will be apparent that the optically readable marking may be provided by any desirable method as appropriate for the application in which the mechanical element is to be used. The markings may have a higher or lower reflectivity than the surface on which they are provided. Equally, it will be apparent that the marking may be provided and detectable in some other manner, such as magnetically, electrically or otherwise as appropriate. Equally, some or all of the methods used herein may be used on markings encoded in some fashion other than by the spacing between markings.

Although the mechanical element shown herein is a piston rod of a hydraulic ram, the marking scheme and process described herein may be used in any other appropriate mechanical element which may not necessarily move linearly; for example a rotating element may be provided with a marking and reader as described herein.

In the examples described above, with particular reference to table 1, the nominal distance for binary "1" is about 900 µm and for binary "0" is 600 µm. Other code widths can of course be used, and respective code dimensions of 1200 µm for binary "1" and 900 µm for binary "2" may be preferable to the code widths of the specific examples.

In the present specification "comprise" means "includes or consists of" and "comprising" means "including or consisting of".

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

The invention claimed is:

1. A calculation module for calculating the position of a moveable element, the calculation module being operable to;
receive an input signal,
detect a first plurality of corresponding features in the input signal,
calculate the spacing between successive features of the first plurality of corresponding features,
generate a first numerical sequence in accordance with the spacing between successive features of the first plurality of corresponding features,
detect a second plurality of corresponding features in the input signal,
calculate the spacing between successive features of the second plurality of corresponding features, and
generate a second numerical sequence in accordance with the spacing between successive features of the second plurality of corresponding features.

2. A calculation module according to claim 1 wherein the step of generating a numerical sequence comprises generating a binary sequence in which a spacing between two successive features having a first value corresponds to a binary '1' digit and a spacing between two successive features having a second value corresponds to a binary '0' digit.

3. A calculation module according to claim 1 operable to generate first verification information associated with the first numerical sequence and second verification information associated with the second numerical sequence to indicate possible errors in the respective numerical sequence.

4. A calculation module according to claim 3 operable to generate verification data such that, where the spacing does not have one of a first value or a second value, the verification data indicates a possible error in the numerical sequence.

5. A calculation module according to claim 4 wherein the first value comprises a first range of values and the second value comprises a second range of values.

6. A calculation module according to claim 5 operable, where the spacing does not have one of a first value or second value, to infer possible digits of the numerical sequence and indicate the inferred digits in the verification data.

7. A calculation module according to claim 6, wherein the step of inferring possible digits comprises one of:
when the spacing is less than the first value and second value, disregarding the spacing;
when the spacing is greater than the first value and second value, inferring a group of two digits in accordance with the spacing.

8. A calculation module according to claim 4 operable to generate verification data indicating a possible error when the spacing is within the first range or second range but wherein the spacing is within a selected distance of the boundary of the range.

9. A calculation module according to claim 1 operable to generate location information in accordance with the numerical sequence.

10. A calculation module according to claim 9 wherein the numerical sequence comprises a part of a pseudorandom binary sequence comprising a plurality of unique words, wherein each word corresponds to a position of the mechanical element.

11. A calculation module according to claim 10 wherein the numerical sequence is longer than a word of the pseudorandom binary sequence, such that the numerical sequence comprises a plurality of words, and wherein the position information comprises a plurality of positions calculated from each numerical sequence.

12. A calculation module according to claim 11 operable to generate first verification information associated with the first numerical sequence and second verification information associated with the second numerical sequence to indicate possible errors in the respective numerical sequence and, wherein a word of the numerical sequence is rejected if the verification data indicates a number of possible errors in that word greater than a maximum error value.

13. A calculation module according to claim 11 operable to generate first verification information associated with the first numerical sequence and second verification information associated with the second numerical sequence to indicate possible errors in the respective numerical sequence and, operable where the verification data indicates that one or more digits of a word have a plurality of possible values, to generate position information from each numerical sequence corresponding to the possible values of the one or more digits.

14. A calculation module according to claim 13 operable to generate a confidence value corresponding to each position.

15. A calculation module according to claim 11 operable, where a plurality of numerical sequences are generated, to calculate position information for each numerical sequence, compare the position information and generate an output position accordingly.

16. A calculation module according to claim 15 operable to generate an output confidence value in accordance with the confidence value corresponding to each position.

17. A calculation module according to claim 16 operable to store a plurality of output positions in a position history and generate a predicted position from the stored output positions and, when a further output position has a corresponding output confidence value lower than a confidence threshold, compare the further output position with the predicted position and, if the further output position is within an acceptance range of the predicted position, accept the further output position as a valid output position and store it in the position history.

18. A calculation module according to claim 17 wherein, if the further output position is outside the acceptance range or below a rejection threshold, the predicted position is used to generate the output position.

19. A calculation module according to claim 18 having a failure counter wherein the failure counter is incremented when the predicted position is used to generate the output position and reset when an output position has a corresponding output confidence value higher than the confidence threshold or is accepted as a valid output position, and wherein a failure output is generated if the failure counter reaches a failure threshold.

20. A calculation module according to claim 1 wherein the plurality of corresponding features of the input signal comprises one of rising edges, falling edges, maxima or minima.

21. A calculation module for calculating the position of a mechanical element, the calculation module being operable to;
   receive an input signal,
   detect a plurality of corresponding features in the input signal,
   calculate the spacing between successive corresponding features,
   generate a numerical sequence in accordance with the spacing between successive corresponding features, and
   generate verification information associated with the numerical sequence to indicate possible errors in the numerical sequence.

22. A calculation module according to claim 21 operable to generate verification data such that, where the spacing does not have one of a first value or a second value, the verification data indicates a possible error in the numerical sequence.

23. A calculation module according to claim 22 wherein the first value comprises a first range of values and the second value comprises a second range of values.

24. A calculation module according to claim 22 operable, where the spacing does not have one of a first value or second value, to infer possible digits of the numerical sequence and indicate the inferred digits in the verification data.

25. A calculation module according to claim 24, wherein the step of inferring possible digits comprises one of:
   when the spacing is less than the first value and second value, disregarding the spacing;
   when the spacing is greater than the first value and second value, inferring a group of two digits in accordance with the spacing.

26. A calculation module according to claim 22 operable to generate verification data indicating a possible error when the spacing is within the first range or second range but wherein the spacing is within a selected distance of the boundary of the range.

27. A calculation module according to claim 21 operable to generate location information in accordance with the numerical sequence.

28. A calculation module according to claim 27 wherein the numerical sequence comprises a part of a pseudorandom binary sequence comprising a plurality of unique words, wherein each word corresponds to a position of the mechanical element.

29. A calculation module according to claim 28 wherein the numerical sequence is longer than a word of the pseudorandom binary sequence, such that the numerical sequence comprises a plurality of words, and wherein the position information comprises a plurality of positions calculated from each numerical sequence.

30. A calculation module according to claim 29 wherein a word of the numerical sequence is rejected if the verification data indicates a number of possible errors in that word greater than a maximum error value.

31. A calculation module according to claim 28 operable, where the verification data indicates that one or more digits of a word have a plurality of possible values, to generate position information from each numerical sequence corresponding to the possible values of the one or more digits.

32. A calculation module according to claim 31 operable to generate a confidence value corresponding to each position.

33. A calculation module according to claim 29 operable, where a plurality of numerical sequences are generated, to calculate position information for each numerical sequence, compare the position information and generate an output position accordingly.

34. A calculation module according to claim 33 operable to generate an output confidence value in accordance with the confidence value corresponding to each position.

35. A calculation module according to claim 34 operable to store a plurality of output positions in a position history and generate a predicted position from the stored output positions and, when a further output position has a corresponding output confidence value lower than a confidence threshold, compare the further output position with the predicted position and, if the further output position is within an acceptance range of the predicted position, accept the further output position as a valid output position and store it in the position history.

36. A calculation module according to claim 35 wherein, if the further output position is outside the acceptance range or below a rejection threshold, the predicted position is used to generate the output position.

37. A calculation module according to claim 36 having a failure counter wherein the failure counter is incremented when the predicted position is used to generate the output position and reset when an output position has a corresponding output confidence value higher than the confidence threshold or is accepted as a valid output position, and wherein a failure output is generated if the failure counter reaches a failure threshold.

38. A calculation module according to claim 21 wherein the plurality of corresponding features of the input signal comprises one of rising edges, falling edges, maxima or minima.

39. An apparatus comprising, a movable mechanical element, a marking, a calculation module for calculating the position of a moveable element, the calculation module being operable to;
   receive an input signal,
   detect a first plurality of corresponding features in the input signal,
   calculate the spacing between successive features of the first plurality of corresponding features,
   generate a first numerical sequence in accordance with the spacing between successive features of the first plurality of corresponding features,
   detect a second plurality of corresponding features in the input signal,
   calculate the spacing between successive features of the second plurality of corresponding features, and
   generate a second numerical sequence in accordance with the spacing between successive features of the second plurality of corresponding features and a reader responsive to the marking to generate an input signal which is passed to the calculation module.

40. An apparatus according to claim 39 wherein the marking is optically readable.

41. An apparatus according to claim 40 wherein the optically readable marking comprises a surface having a first reflectivity and a plurality of areas having a second reflectivity, wherein said areas having a second reflectivity have a width which is generally constant in a direction parallel to the direction of movement of the mechanical element and each binary digit is indicated by the spacing between two of said areas having a second reflectivity.

42. An apparatus according to claim 40 wherein the reader comprises an illumination source and a detector comprising a detector array.

43. An apparatus according to claim 39 wherein the marking is provided on the mechanical element.

44. An apparatus according to claim 39 wherein the mechanical element comprises a piston rod of a fluid operated ram.

45. An apparatus comprising a movable mechanical element, a marking, a calculation module for calculating the position of a mechanical element, the calculation module being operable to;
- receive an input signal,
- detect a plurality of corresponding features in the input signal,
- calculate the spacing between successive corresponding features,
- generate a numerical sequence in accordance with the spacing between successive corresponding features, and
- generate verification information associated with the numerical sequence to indicate possible errors in the numerical sequence.

and a reader responsive to the marking to generate an input signal which is passed to the calculation module.

46. An apparatus according to claim 45 wherein the marking is optically readable.

47. An apparatus according to claim 46 comprising wherein the optically readable marking comprising a surface having a first reflectivity and a plurality of areas having a second reflectivity, wherein said areas having a second reflectivity have a width which is generally constant in a direction parallel to the direction of movement of the mechanical element and each binary digit is indicated by the spacing between two of said areas having a second reflectivity.

48. An apparatus according to claim 46 wherein the reader comprises an illumination source and a detector comprising a detector array.

49. An apparatus according to claim 45 wherein the marking is provided on the mechanical element.

50. An apparatus according to claim 45 wherein the mechanical element comprises a piston rod of a fluid operated ram.

* * * * *